(12) United States Patent
Lerner et al.

(10) Patent No.: US 7,954,358 B2
(45) Date of Patent: Jun. 7, 2011

(54) LASER DRIVER BIAS CURRENT CALIBRATION

(75) Inventors: Victor Jacob Lerner, Foster City, CA (US); Jingyun Zou, Palo Alto, CA (US); Hung Van Nguyen, San Jose, CA (US); Charles Steven Joiner, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 716 days.

(21) Appl. No.: 12/047,495

(22) Filed: Mar. 13, 2008

(65) Prior Publication Data

US 2008/0225910 A1 Sep. 18, 2008

Related U.S. Application Data

(60) Provisional application No. 60/895,077, filed on Mar. 15, 2007.

(51) Int. Cl.
*G01D 18/00* (2006.01)

(52) U.S. Cl. .......................... 73/1.01; 398/107

(58) Field of Classification Search ............. 372/29.015, 372/34; 73/1.01
See application file for complete search history.

(56) References Cited

U.S. PATENT DOCUMENTS

| | | | |
|---|---|---|---|
| 5,691,808 A | | 11/1997 | Nourrcier, Jr. et al. |
| 5,812,572 A | * | 9/1998 | King et al. ................. 372/38.04 |
| 6,494,370 B1 | | 12/2002 | Sanchez |
| 6,891,866 B2 | | 5/2005 | Robinson et al. |
| 6,967,320 B2 | | 11/2005 | Chieng et al. |
| 7,509,050 B2 | * | 3/2009 | Ekkizogloy et al. .......... 398/135 |
| 7,529,488 B2 | * | 5/2009 | Burdick et al. ............... 398/137 |
| 7,639,952 B2 | * | 12/2009 | Nelson .......................... 398/136 |

* cited by examiner

*Primary Examiner* — Minsun Harvey
*Assistant Examiner* — Tuan N. Nguyen
(74) *Attorney, Agent, or Firm* — Maschoff Gilmore & Israelsen

(57) ABSTRACT

A method for a calibration module to calibrate laser bias current in an optical transceiver. The method comprises causing the calibration module to configure a control module of the optical transceiver for a calibration operation, causing the calibration module to determine a laser bias current monitored by the control module, and determining one or more calibration factor values that cause the laser bias current monitored by the control module to substantially match a laser bias current as measured by an external test meter.

17 Claims, 10 Drawing Sheets

LASER DRIVER BIAS CURRENT CALIBRATION

CROSS-REFERENCE TO RELATED APPLICATIONS

This application claims the benefit of Unites States Provisional Application No. 60/895,077, filed Mar. 15, 2007, which is incorporated herein by reference in its entirety.

BACKGROUND

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed through it, the intensity of the emitted light being a function of the current magnitude. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include a driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to amplify the channel-attenuated received signal prior to further processing. A controller circuit or module controls the operation of the laser driver and post-amplifier.

BRIEF SUMMARY

The principles of the present invention relate to a method for a calibration module to calibrate laser bias current in an optical transceiver. The method comprises causing the calibration module to configure a control module of the optical transceiver for a calibration operation, causing the calibration module to determine a laser bias current monitored by the control module, and determining one or more calibration factor values that cause the laser bias current monitored by the control module to substantially match a laser bias current as measured by an external test meter.

The principles of the present invention also relate to a method for calibrating laser bias current in an optical transceiver. The method comprises coupling the optical transceiver with a test meter configured to measure a laser bias current produced by a laser driver of the optical transceiver, coupling the optical transceiver to a calibration test module, causing the calibration test module to determine the laser bias current as measured by a control module of the optical transceiver, and causing the calibration test module to determine a calibration factor value configured to cause the laser bias current as measured by the control module to substantially match the laser bias current as measured by the test meter.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

The principles of the present invention relate to a calibration module and method for calibrating the bias current of an optical transceiver laser driver or like device. The calibration module and method advantageously allow for the efficient calibration of the laser driver prior to the attachment of the laser or other such optical device to the optical transceiver. An optical transceiver module will first be described to provide background for the calibration process. The calibration module and method of the present invention will then be described. Note that the optical transceiver module described below if for illustration only and should not be used to limit the scope of the present invention as other transceiver configurations may also be calibrated by the principles of the present invention.

Figure 1A:
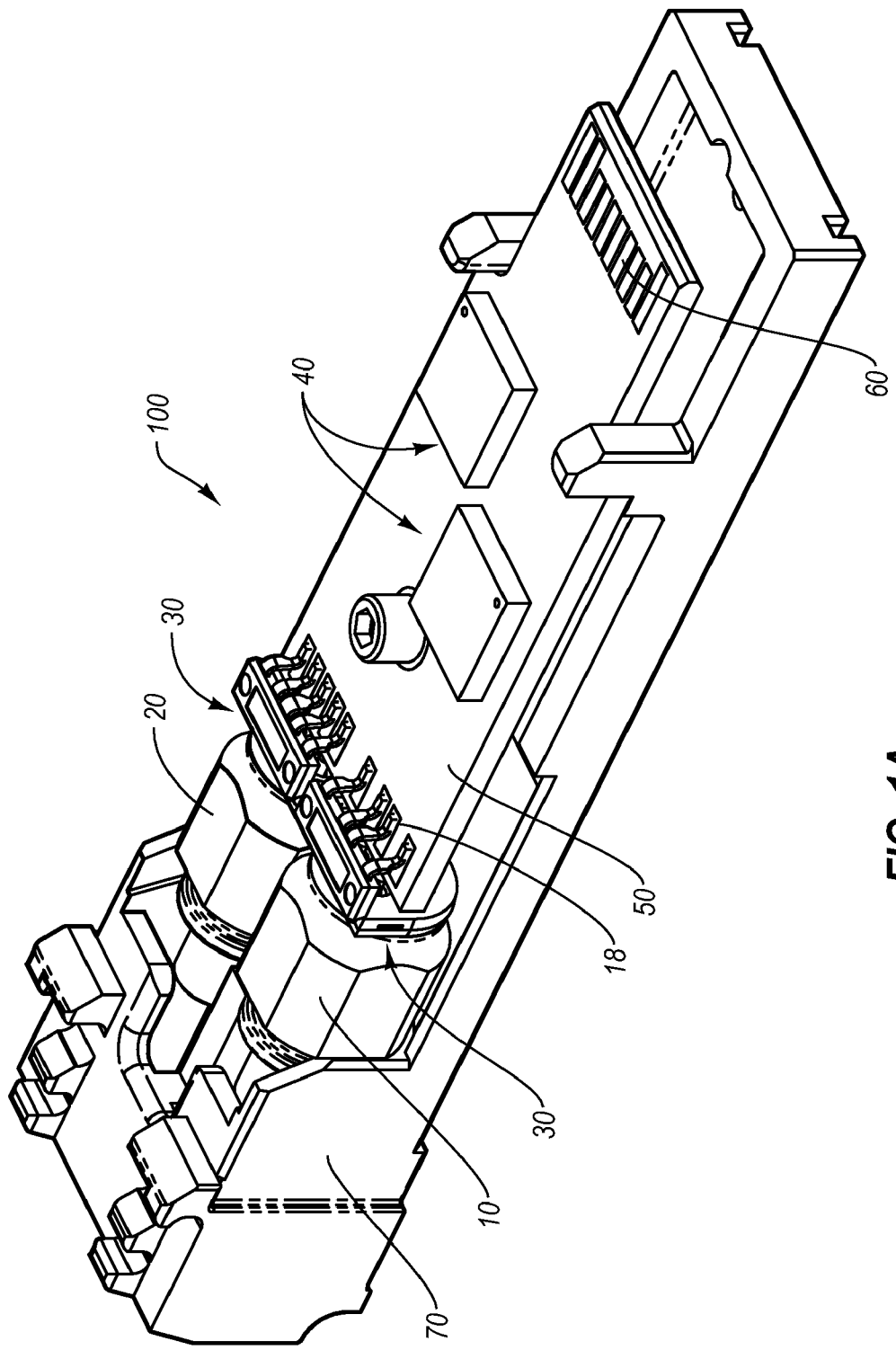
FIG. 1A is a perspective view of an example of an optical transceiver module.

Reference is first made to FIG. 1A, which depicts a perspective view of an example optical transceiver module ("transceiver"), generally designated at 100, for use in transmitting and receiving optical signals in connection with an external host that is operatively connected, in one embodiment, to a communications network. As shown, the transceiver shown in FIG. 1 includes various components, including a Receiver Optical Subassembly ("ROSA") 10, a Transmitter Optical Subassembly ("TOSA") 20, electrical interfaces 30, various electronic components 40, such as a laser-driver/post-amplifier and a control module for example, and a printed circuit board 50 which supports the electronic components 40.

In the illustrated embodiment, two electrical interfaces 30 are included in the transceiver 100, one each used to electrically connect the ROSA 10 and the TOSA 20 to a plurality of conductive pads located on the PCB 50. The electronic components 40 are also attached to the PCB 50. An edge connector 60 is located on an end of the PCB 50 to enable the transceiver 100 to electrically and mechanically interface with a host (not shown). In addition, the above-mentioned components of the transceiver 100 are partially housed within a housing 70. Though not shown, some embodiments include a shell that cooperates with the housing 70 to define an enclosure for components of the transceiver 100.

Figure 1B:
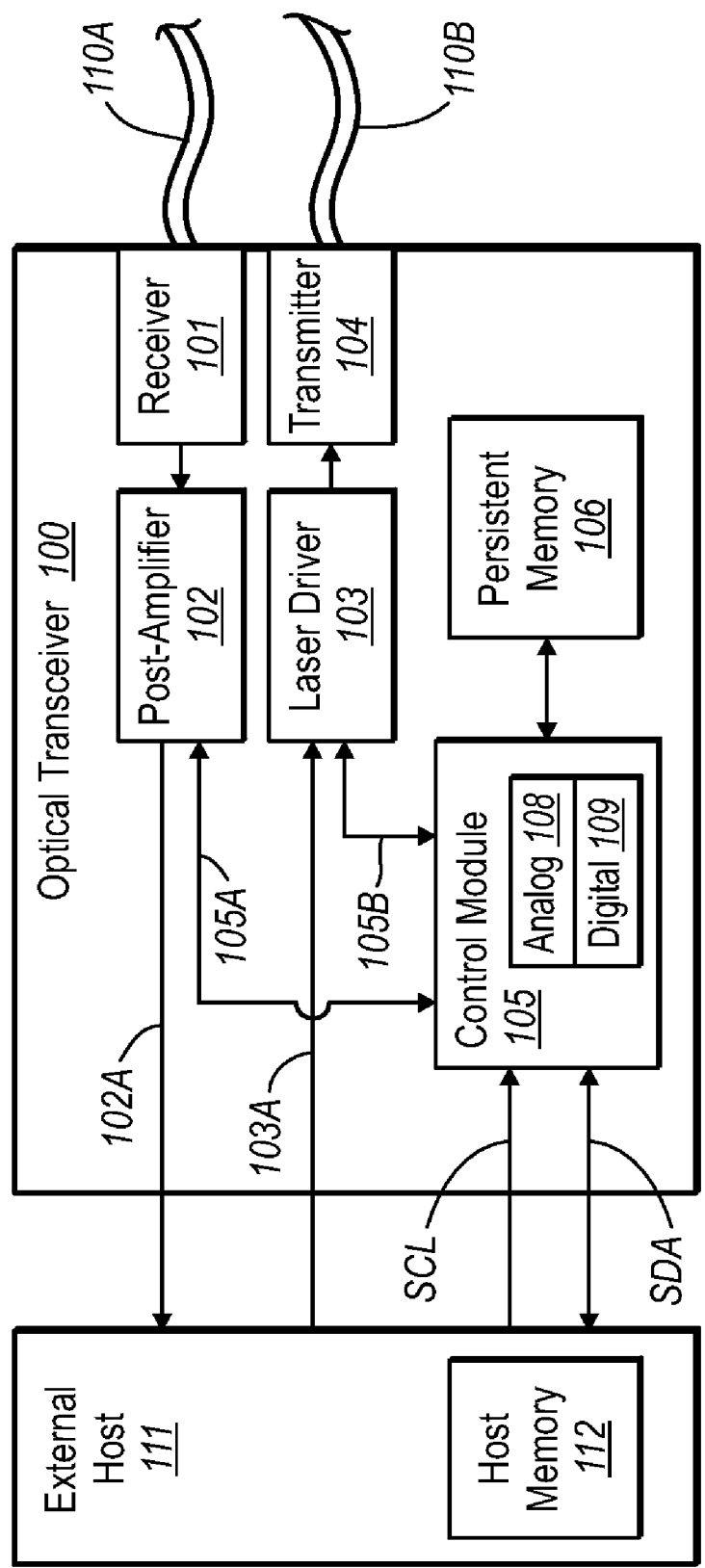
FIG. 1B is a simplified block view showing various aspects of the optical transceiver module of FIG. 1A.

Reference is now made to FIG. 1B, which is a simplified block diagram of an example of an optical transceiver, denoted at 100 in FIG. 1A, depicting various physical and operational aspects of the transceiver. While the optical transceiver 100 will be described in some detail, the optical transceiver 100 is described by way of illustration only, and not by way of restricting the scope of the invention. As mentioned above, the optical transceiver 100 in one embodiment is suitable for optical signal transmission and reception at a variety of per-second data rates, including 1 Gbit/s, 2 Gbit/s, 4 Gbit/s, 10 Gbit/s, as well as even higher data rates. Furthermore, the embodiments described herein can be implemented in optical transceivers conforming with any of a variety of different form factors, examples of which include, but are not limited to, XFP, SFP and SFF, as well as a variety of different communication protocols, examples of which include, but are not limited to, GiGE, SONET, and Fibre Channel.

With continuing reference to FIG. 1B, and with reference as well to FIG. 1A, transceiver 100 includes printed circuit board ("PCB") 50 on which the various electronic components of the transceiver are mounted. One such component is a control module 105. Control module 105 is connected to an integrated post-amplifier/laser driver ("PA/LD") 102 by connections 105A and 105B. These connections allow control module 105 to monitor the operation of the post-amplifier/laser driver 102 as will be described in more detail to follow. Control module 105 is connected to a persistent memory 106, which stores microcode for configuring control module 105 and is also used to store operational parameters. The control module 105 is also able to communicate with an external host 111 as depicted by the Serial Data line (SDA) and Serial Clock line (SCLi).

Transceiver 100 includes both a transmit path and a receive path, both of which will now be described. The receive path includes ROSA 10, which transforms an incoming optical data signal into an electrical data signal. The electrical data signal is then provided to a post-amplifier portion of PA/LD 102. The post-amplifier amplifies and otherwise processes the electrical data signal and provides the electrical data signal to the external host 111 via connection 102A.

For the transmit path, external host 111 generates an electrical data signal and provides the electrical data signal to a laser driver portion of PA/LD 102 via connection 102B. The laser driver processes the electrical data signal and drives the TOSA 20, which causes the TOSA 20 to emit an optical data signal.

The operation of transceiver 100 will now be described in further detail. In operation, the optical transceiver 100, receives an optical data signal from a fiber 110A via the ROSA 10 in manner to be described more fully below. The ROSA 10 transforms the received optical data signal into an electrical data signal. The ROSA 10 then provides the resulting electrical data signal to a post-amplifier. In the illustrated embodiment, the post amplifier is consolidated with the laser driver as an integrated PA/LD 102. As such, the PA/LD 102 resides on a single integrated circuit chip and is included as a component, together with the other electronic components 40, some of which are further described below, on PCB 50. In other embodiments, the post amplifier and laser driver are implemented as separate components on the PCB 50.

The post-amplifier portion of the PA/LD 102 amplifies the received electrical data signal and provides the amplified data signal to external host 111 over signal path 102A. The external host 111 may be any computing system capable of communicating with the optical transceiver 100. The external host 111 contains a host memory 112 that may be any volatile or non-volatile memory source. In one embodiment, some components of the optical transceiver 100 can reside on the host 111 while the other components of the transceiver reside on the PCB 50 separate from the host 111.

The optical transceiver 100 may also receive electrical data signals from the host 111 for transmission onto a fiber 10B. Specifically, the laser driver portion of the PA/LD 102 receives the electrical data signal from the host 111 via the signal path 102B, and drives a light source within the TOSA 20. One example of a light source is a DML or a VCSEL that causes the TOSA 20 to emit onto the fiber 110B optical data signals representative of the information in the electrical data signal provided by the host 111.

The behavior of the ROSA 10, the PA/LD 102, and the TOSA 20 may vary dynamically due to a number of factors. For example, temperature changes, power fluctuations, and feedback conditions may each affect the performance of these components. Accordingly, the transceiver 100 includes a control module 105, which may evaluate environmental conditions, such as temperature, age of the laser, and/or operating conditions, such as voltage or bias current, and receive information from the post-amplifier portion of the PA/LD 102 by way of connection 105A, and from the laser driver portion of the PA/LD by way of connection 105B. This arrangement allows the control module 105 to optimize the performance of the laser to compensate for dynamically varying conditions.

Specifically, the control module 105 optimizes the operation of the transceiver 100 by adjusting settings on the PA/LD 102 as represented by the connections 105A and 105B. These settings adjustments can be intermittent and are generally only made when temperature or voltage or other low frequency changes so warrant. For example, the control module may include sensors that allow it to monitor and measure the laser bias current provided by the laser driver portion of PA/LD 102. In some embodiments, an the control module may include an analog-to-digital converter (ADC) that allow it to receive analog signals from the laser driver portion of PA/LD 102 and then convert these signals to digital signals. This allows control module 105 to use connection 105B to direct the laser driver portion of PA/LD 102 to adjust the laser bias current up or down as needed.

The control module 105 has access to a persistent memory 106, which in one embodiment, is an Electrically Erasable and Programmable Read Only Memory (EEPROM). Persistent memory 106 may also be any other non-volatile memory source. Persistent memory 106 is used to store microcode for configuring control module 105 and for storing operational parameters that have been measured by the control module 105. The persistent memory 106 and the control module 105 may be packaged together in the same package or in different packages without restriction.

Data and clock signals may be provided from the host 111 to the control module 105 using the SDA and SCL lines respectively. Also data may be provided from the control module 105 to the host 111 to allow for transmitting diagnostic data such as environmental and/or operational parameters. The control module 105 includes both an analog portion 108 and a digital portion 109. In this example, the analog portion 108 and the digital portion 109 collectively enable the control module to implement logic digitally, while still largely interfacing with the rest of the optical transceiver 100 using analog signals.

Figure 2:
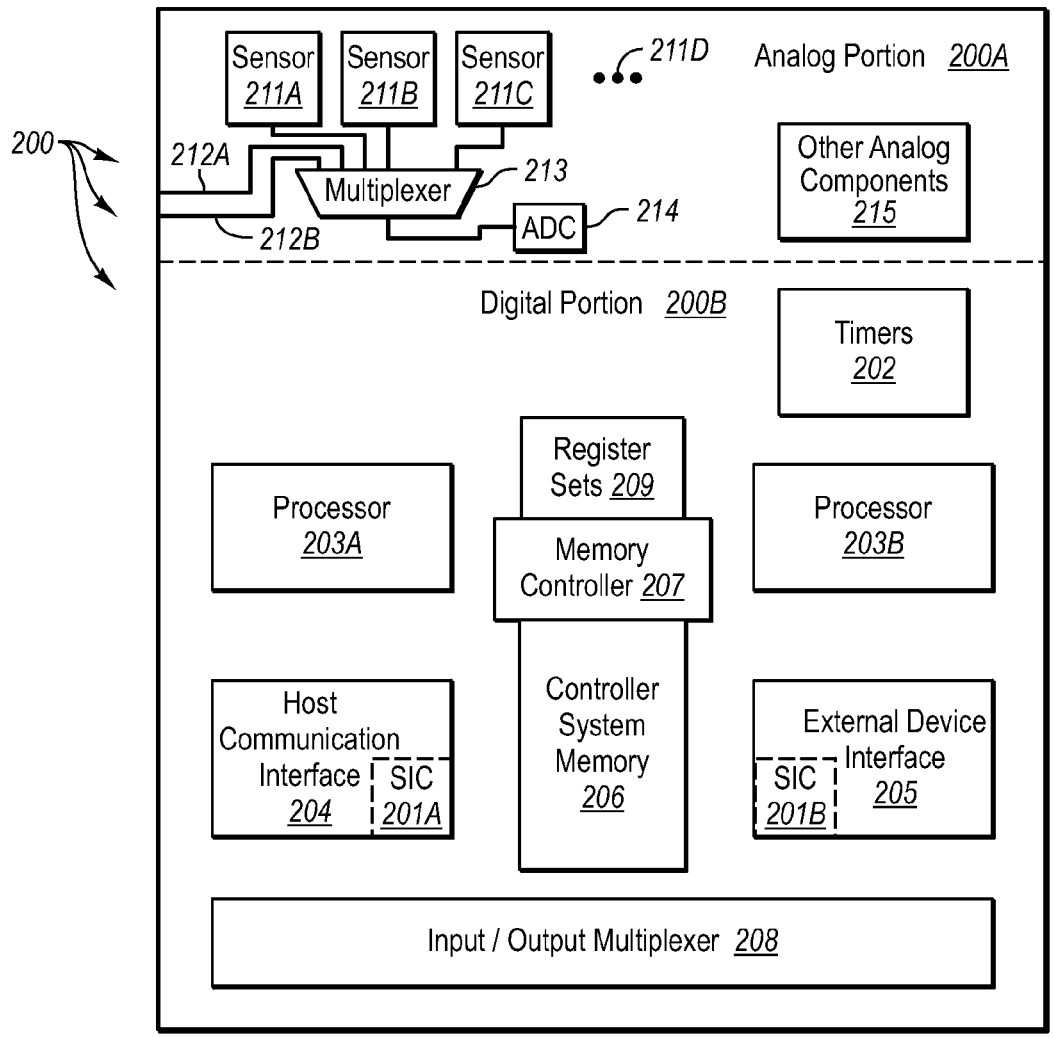
FIG. 2 schematically illustrates an example of the control module of FIG. 1B.

FIG. 2 schematically illustrates an example 200 of the control module 105A in further detail. The control module 200 includes an analog portion 200A that represents an example of the analog portion 108 of FIG. 1, and a digital portion 200B that represents an example of the digital portion 109 of FIG. 1.

For example, the analog portion 200A may contain digital to analog converters, analog to digital converters, high speed comparators (e.g., for event detection), voltage based reset generators, voltage regulators, voltage references, clock generator, and other analog components. For example, the analog portion 200A includes sensors 211A, 211B, 211C amongst potentially others as represented by the horizontal ellipses 211D. Each of these sensors may be responsible for measuring operational parameters that may be measured from the control module 200 such as, for example, supply voltage, bias current or voltage, and transceiver temperature. The control module may also receive external analog or digital signals from other components within the optical transceiver that indicate other measured parameters such as, for example, laser bias current, transmit power, receive power, laser wavelength, laser temperature, and Thermo Electric Cooler (TEC) current. Two external lines 212A and 212B are illustrated for receiving such external analog signals although there may be many of such lines.

The internal sensors may generate analog signals that represent the measured values. In addition, the externally provided signals may also be analog signals. In this case, the analog signals are converted to digital signals so as to be available to the digital portion 200B of the control module 200 for further processing. Of course, each analog parameter value may have its own Analog to Digital Converter (ADC). However, to preserve chip space, each signal may be periodically sampled in a round robin fashion using a single ADC such as the illustrated ADC 214. In this case, each analog value may be provided to a multiplexer 213, which selects in a round robin fashion, one of the analog signals at a time for sampling by the ADC 214. Alternatively, multiplexer 213 may be programmed to allow any order of analog signals to be sampled by ADC 214.

As previously mentioned, the analog portion 200A of the control module 200 may also include other analog components 215 such as, for example, digital to analog converters, other analog to digital converters, high speed comparators (e.g., for event detection), voltage based reset generators, voltage regulators, voltage references, clock generator, and other analog components.

The digital portion 200B of the control module 200 may include a timer module 202 that provides various timing signals used by the digital portion 200B. Such timing signals may include, for example, programmable processor clock signals. The timer module 202 may also act as a watchdog timer.

Two general-purpose processors 203A and 203B are also included. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 203A and 203B are each a 16-bit processor and may be identically structured. The precise structure of the instruction set is not important to the principles of the present invention as the instruction set may be optimized around a particular hardware environment, and as the precise hardware environment is not important to the principles of the present invention.

A host communications interface 204 is used to communicate with the host, possibly implemented using a two-wire interface such as I$^2$C shown in FIG. 1 as the serial data (SDA) and serial clock (SCL) lines on the optical transceiver 10A. Other host communication interfaces may also be implemented as well. Data may be provided from the control module 105A to the host using this host communications interface to allow for digital diagnostics and readings of temperature levels, transmit/receiver power levels, and the like. The external device interface 205 is used to communicate with, for example, other modules within the optical transceiver 100A such as, for example, the post-amplifier 102A, the laser driver 103A, or the persistent memory 106A.

The internal controller system memory 206 (not to be confused with the external persistent memory 106A) may be Random Access Memory (RAM) or non-volatile memory. The memory controller 207 shares access to the controller system memory 206 amongst each of the processors 203A and 203B and with the host communication interface 204 and the external device interface 205. In one embodiment, the host communication interface 204 includes a serial interface controller 201A, and the external device interface 205 includes a serial interface controller 201B. The two serial interface controllers 201A and 201B may communicate using a two-wire interface such as I$^2$C or another interface so long as the interface is recognized by both communicating modules. One serial interface controller (e.g., serial interface controller 201B) is a master component, while the other serial interface controller (e.g., serial interface controller 201A) is a slave component.

An input/output multiplexer 208 multiplexes the various input/output pins of the control module 200 to the various components within the control module 200. This enables different components to dynamically assign pins in accordance with the then-existing operational circumstances of the control module 200. Accordingly, there may be more input\output nodes within the control module 200 than there are pins available on the control module 200, thereby reducing the footprint of the control module 200.

Register sets 209 contain a number of individual registers. These registers may be used by the processors 203 to write microcode generated data that controls high speed comparison in optical transceiver 10A. Alternatively, the registers may hold data selecting operational parameters for comparison. Additionally, the registers may be memory mapped to the various components of optical transceiver 100A for controlling aspects of the component such as laser bias current or transmit power.

As described above, a control module such as control module 105 may be used to control the amount of bias current provided by a laser driver such as the laser driver portion of PA/LD 102. Typically, the control module measures the amount of bias current and directs the laser driver to adjust the laser bias current as needed. However, in many transceivers, control module 105 measures the bias current imprecisely due to error introduced by the sensors 211 of control module 105. This in turn often causes the control module to improperly adjust the bias current, which can lead to poor laser performance, insufficient laser eye safety margin, laser damage or can shorten the life of the laser. In the past, a calibration method to help fix these problems was generally not available. Advantageously, the principles of the present invention allow for calibration of the laser bias current produced by the laser driver at manufacture time to substantially correct any imprecise measurements made by the control module. Accordingly, the operation of the optical transceiver is improved as damage to the laser is lessened and the life of the laser is extended.

Figure 3:
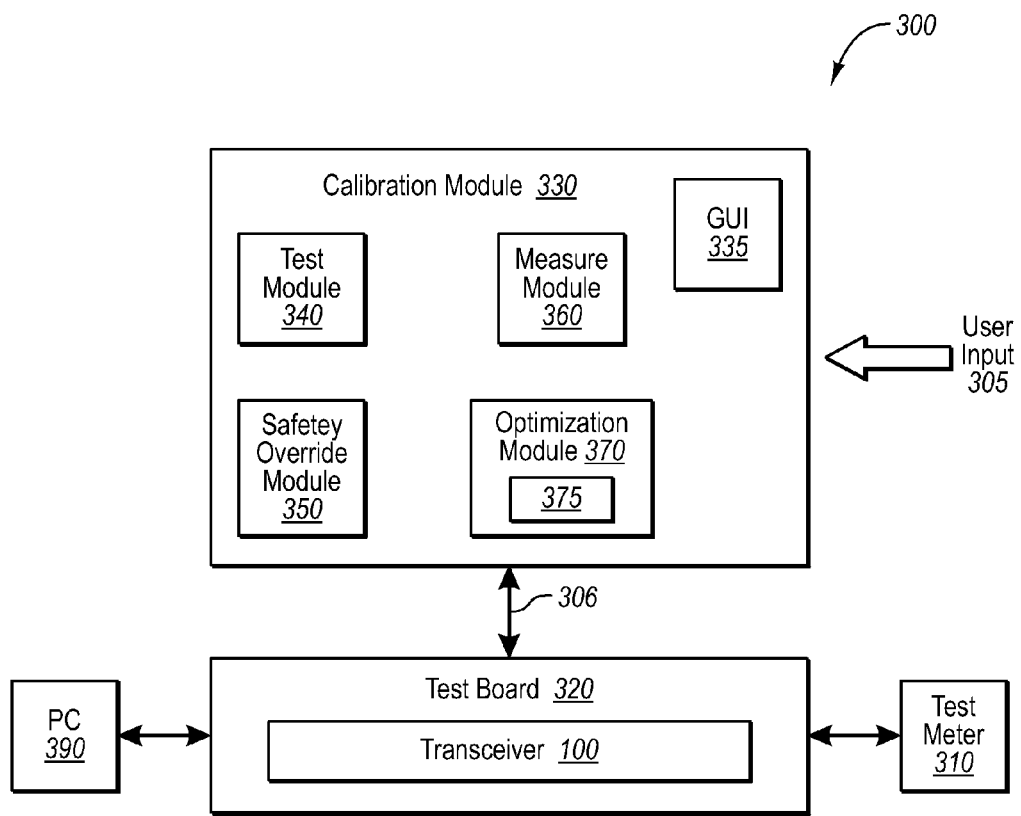
FIG. 3 is a block diagram of a testing environment suitable for calibrating laser bias current in accordance with embodiments of the present invention.

Reference is now made to FIG. 3, which illustrates a testing environment 300 that may be suitable for calibrating the bias current of the laser driver of PA/LD 102 previously discussed. Testing environment 300 includes various modules and components that operate to perform the calibration process. As one of skill in the art will realize after having read this description, testing environment 300 may include other modules or components not illustrated and that the operations to be described may be performed by one or more of the modules and components.

As illustrated, testing environment 300 includes a test meter 310 and a test board 320. Test meter 310 may be any reasonable test meter such as a Fluke meter that is configured to measure laser bias current. In operation, the test meter 310 is connected to the optical transceiver 100 in such a way as to allow the test meter to directly measure the bias current produced by the laser driver portion of PA/LD 102. In this way a highly accurate measurement of the actual laser bias current may be achieved.

Figure 4:
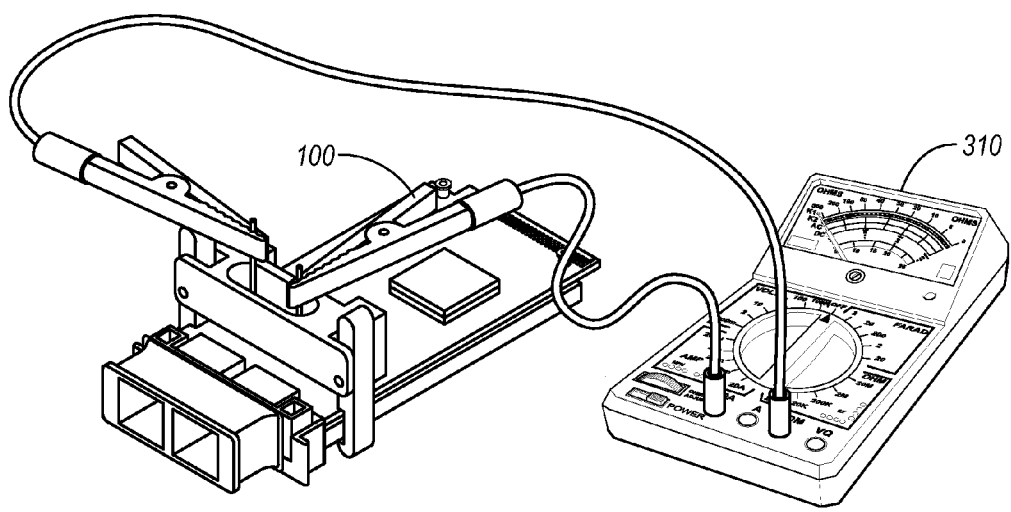
FIG. 4 illustrates the connection of a test board and test meter in accordance with embodiments of the present invention.

Test board 320 may be any reasonable test board. In the present embodiment, test board 320 may be configured to hold transceiver 100 and to provide the electrical connections and power necessary for the calibration operation. In addition, test board 320 may also be configured to communicate with calibration module 330 as will be explained. On example embodiment of the connection of test board 320 and test meter 310 is illustrated in FIG. 4. In other embodiments, a computer 390 may connected to test board 320.

As illustrated, testing environment 300 also includes a calibration module 330. Calibration module 330, along with the various modules that comprise calibration module 330, may be implemented as hardware, software, or any combination of hardware and software. When implemented as software, calibration module 330 may reside on computer 390.

In operation, calibration module 330 is configured to calibrate the laser bias current of an optical transceiver prior to attaching the actual laser. The following operations may be performed by one or more of the individual modules of calibration module 330. For example, a user may place a transceiver 100 into test board 320 and may then connect test board 320 with calibration module 330, specifically allowing calibration module 330 to monitor and optimize the operation of control module 105.

Calibration module 330 includes a Graphical Users Interface (GUI) 335 that may be utilized by the other modules of calibration module 330. The GUI 335 is configured to receive user input that helps to configure control module 105 as will be explained in more detail to follow.

Calibration module 330 also includes a test module 340. Test module 340 causes control module 105 to operate in specified way. For example, test module 340 receives user input 305 that causes test module 340 to configure control module 105 in a desired manner. Further, test module 340 may receive user input 305 that causes test module 340 to direct control module 105 to adjust the laser bias current up or down.

Figure 5:
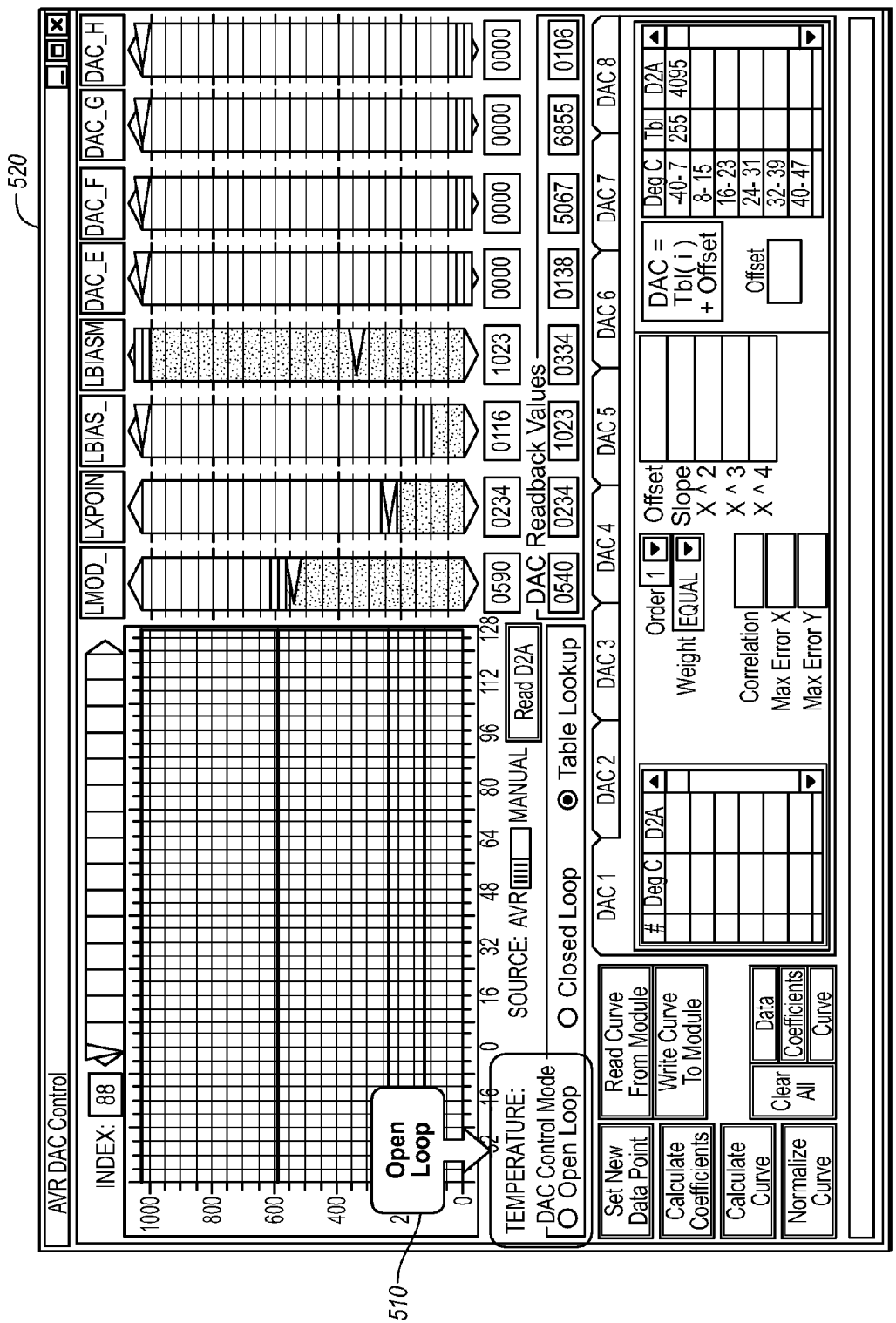
FIG. 5 illustrates an embodiment of a graphical user interface in accordance with the present invention.

In one embodiment, test module 340 may utilize GUI 335 to receive the user input 305 for configuring control module 105. For example, as illustrated in FIG. 5 the GUI 335 may allow the user to specify open loop DAC control mode 510 for control module 105. The user may also use the GUI to adjust the laser bias bar 520, thus causing the laser bias current to adjust as previously described. Of course, it will be appreciated that the other control modes and operational bars as illustrated in FIG. 5 may also be selected as circumstances warrant.

Figure 6:
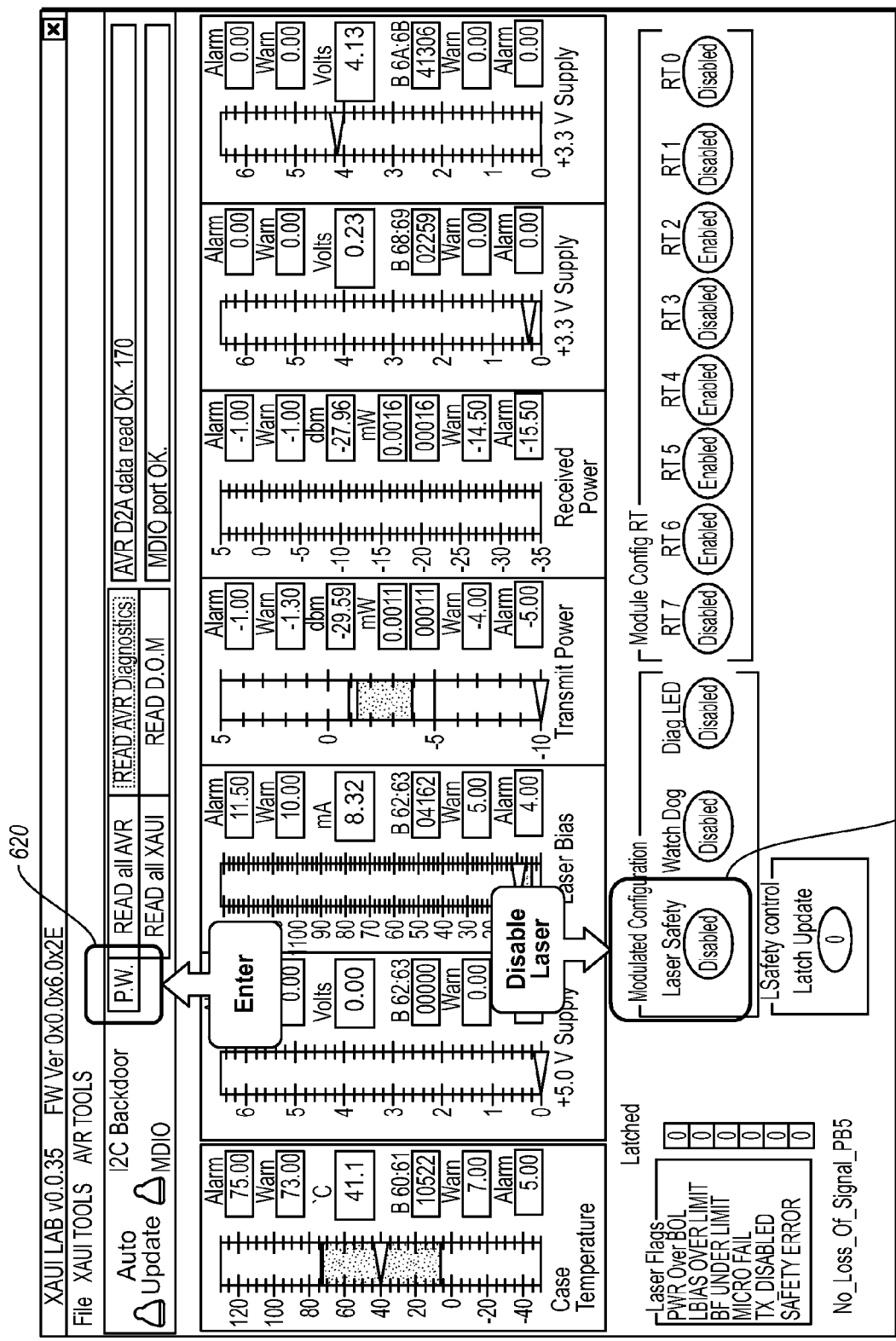
FIG. 6 illustrates an embodiment of a graphical user interface in accordance with the present invention.

In some embodiments, optical transceiver 100 may have a laser safety mode. The laser safety mode typically prevents the laser bias current from reaching a level that would cause the optical transceiver to emit dangerous levels of laser light. However, it is often necessary for calibration module 330 to cause control module 105 to direct the laser driver portion of PA/LD 102 to produce such a current level. Accordingly, calibration module 330 may include a safety override module 350. Safety override module 350 may be configured to disable the laser safety features of transceiver 100. In some embodiments, a user is required to input a password before module 350 will override the safety features to prevent unauthorized overrides. FIG. 6 illustrates one embodiment of GUI 335 being utilized by for safety override module 350. As illustrated, a laser safety disable 610 allows a user to disable the laser safety mode. Further, password input 620 may be used in those embodiments where a password is required as previously described.

Figure 7:
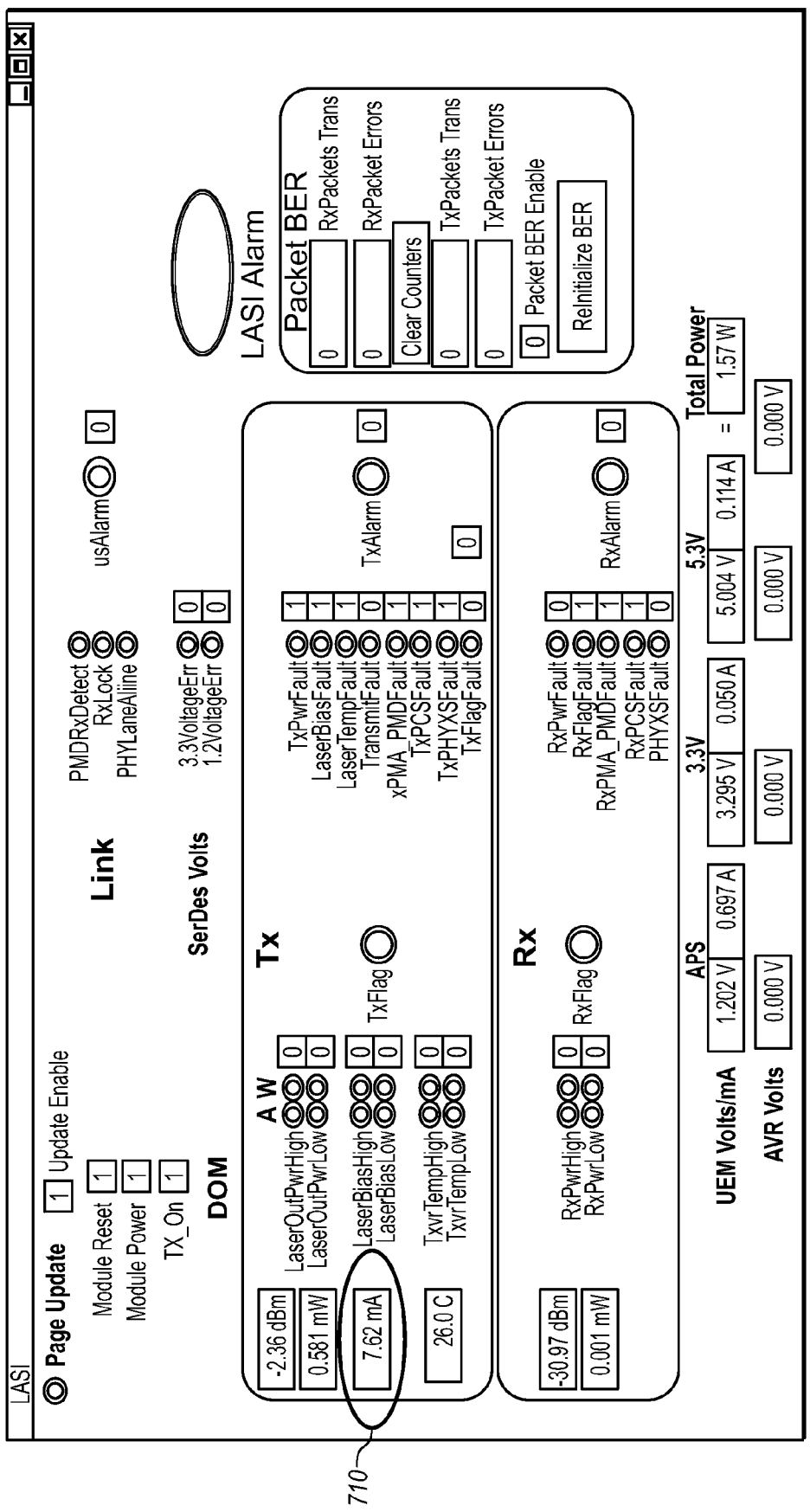
FIG. 7 illustrates an embodiment of a graphical user interface in accordance with the present invention.

Calibration module 330 further includes a measure module 360 that is configured to receive laser bias current measurement input 306 from control module 105 and to display this information. As mentioned, control module 105 is configured to monitor the bias current of the laser driver. Measure module 360 receives this data and then displays the bias current as measured by control module 105. In some embodiments, this measurement may be displayed using GUI 335 as is illustrated in FIG. 7. Note that in FIG. 7, the bias current is displayed at 710 as 7.62 mA.

As mentioned previously, the laser bias current as read by control module 105 may not be the actual laser bias current produced by the laser driver portion of PA/LD 102. Accordingly, calibration module 330 may also include an optimization module 370. Optimization module 370 includes a calibration factor table that includes calibration factor information 375. The calibration factor information 375 is configured to cause control module 105 to adjust for or account for any differences between the actual measured laser bias current and the laser bias current measured by the control module. As mentioned previously, this difference is often caused by the inherent limitations of the sensors 211 of the control module.

In operation, a comparison, either by the user, by optimization module 370, or some other source, is made of the actual laser bias current measured by test meter 310 and the laser bias current as measured by control module 105 and measure module 360. If the laser bias current values are different, input 305 is received that changes one or more values of the calibration factor information 375. These changed values will in turn cause the laser bias current as measured by control module 105 and measure module 360 to adjust up or down as the inherent errors are accounted for.

Figure 8:
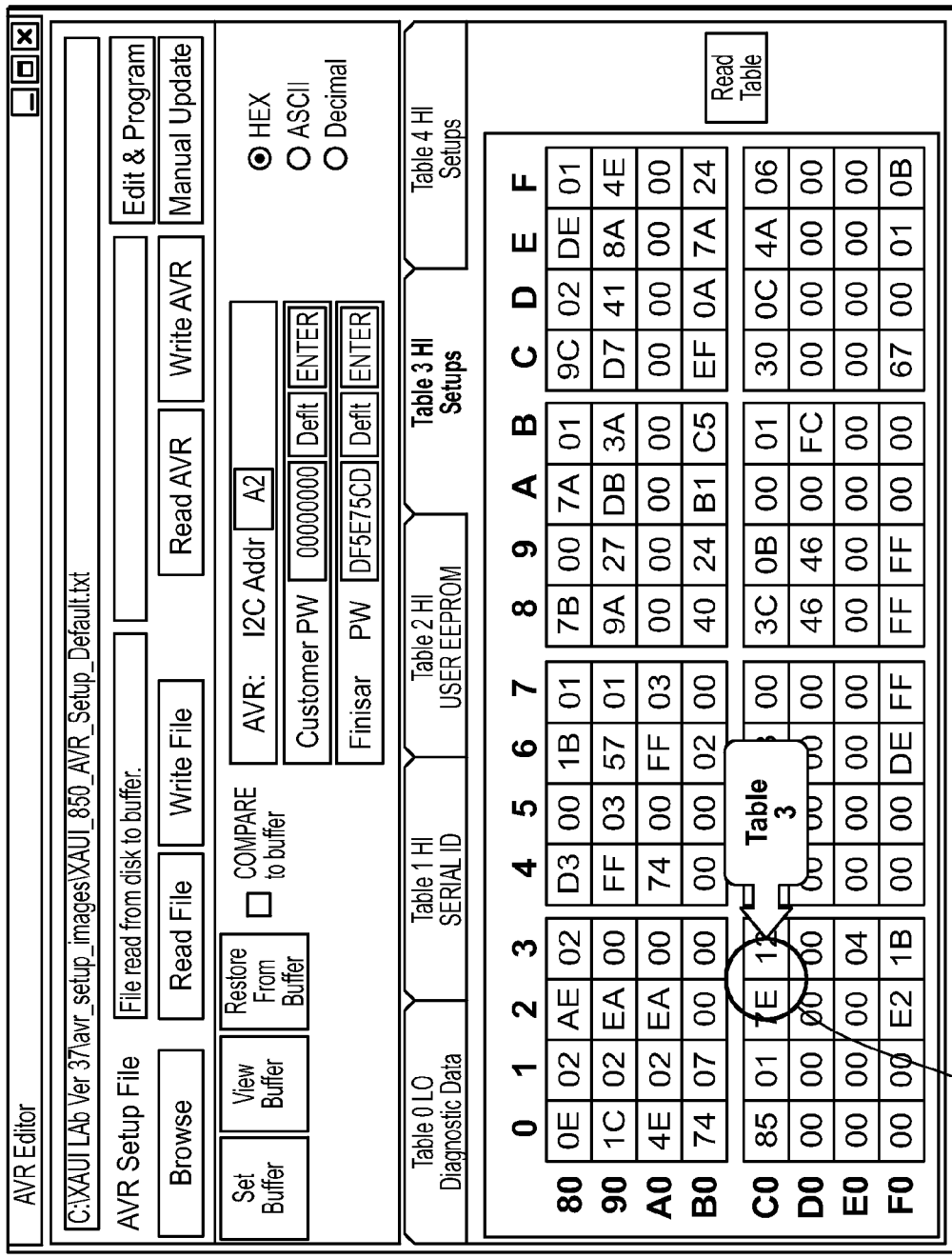
FIG. 8 illustrates an embodiment of a graphical user interface in accordance with the present invention.

Additional input 305 is then received that changes the one or more values of the calibration factor information 375 until the actual bias current as measured by test meter 310 and the laser bias current as measured by control module 105 and measure module 360 is substantially the same. In one embodiment, the two values should be within +/−0.11 mA of each other. In other embodiments, other tolerances may be utilized as circumstances warrant. In some embodiments, optimization module 370 may utilize GUI 335 for receiving the input 305 that changes the calibration factor information values 375 as is illustrated in FIG. 8 at 810.

Once the two measured laser bias current values are substantially the same, the optimization module 370 notes the one or more values of the calibration factor information 375 that caused the laser bias current as measured by the control module 105 and measure module 360 to be substantially the same as the laser bias current as measured by test meter 310. This calibration factor information 375 may then be stored in persistent memory 106 of transceiver 100. Accordingly, in later operation transceiver 100 will use the stored calibration factor information 375 when measuring the laser bias current produced by the laser driver portion of PA/LD 102. The stored calibration factor information 375 will cause control module 105 to account for the inherent measurement errors previously discussed and thus measure the laser bias current much more precisely than if the calibration operation had not been performed.

A specific example will know be described. For example, a user, which may be a human user or a computing system, may connect transceiver 100 to test meter 310 and test board 320 as previously described. The user may then provide input 305 to test module 340 through use of GUI 335 as illustrated in FIG. 4 to cause control module 105 to operate in the DAC open loop mode. If necessary, the user may provide input 305 to safety override module 350 as previously described.

Input 306 may then be received by measure module 360 that indicates the laser bias current as measured or monitored by control module 105. For example, the user may access GUI 335 as illustrated in FIG. 6, which shows the laser bias current as measured or monitored by control module 105 to be 7.62 mA. Suppose that the actual laser bias current as measured by test meter 310 is 7.5 mA.

The user or optimization module 370 may then compare the measured 7.5 mA of test meter 310 to the 7.62 mA described above. Note that the 7.62 mA as measured by the control module 105 is 0.12 mA different from the actual measured 7.5 mA due to the inherent monitoring limitations and errors previously described. The user may then access optimization module 370 and calibration factor information 375 and provide input 305 that changes the calibration factor information.

For example, the user may access GUI 335 as illustrated in FIG. 8 and input new calibration factor information 375 values into the displayed table, specifically columns 2 and 3 of row CO as denoted by 810. Changing these calibration factor information values will cause the laser bias current displayed by measure module 360 to adjust up or down as the inherent errors are accounted for. The user may continue to input new calibration factor information 375 values until the displayed value is within +/−0.11 mA or some other desired tolerance of the 7.5 mA measured by test meter 310. The new calibration factor information 375 entered in causes control module 105 to account for or compensate for the 0.12 mA difference between the actual laser bias current and what the control module measures. The calibration factor information value is then provided to persistent memory 106 for future use as described.

Figure 9:
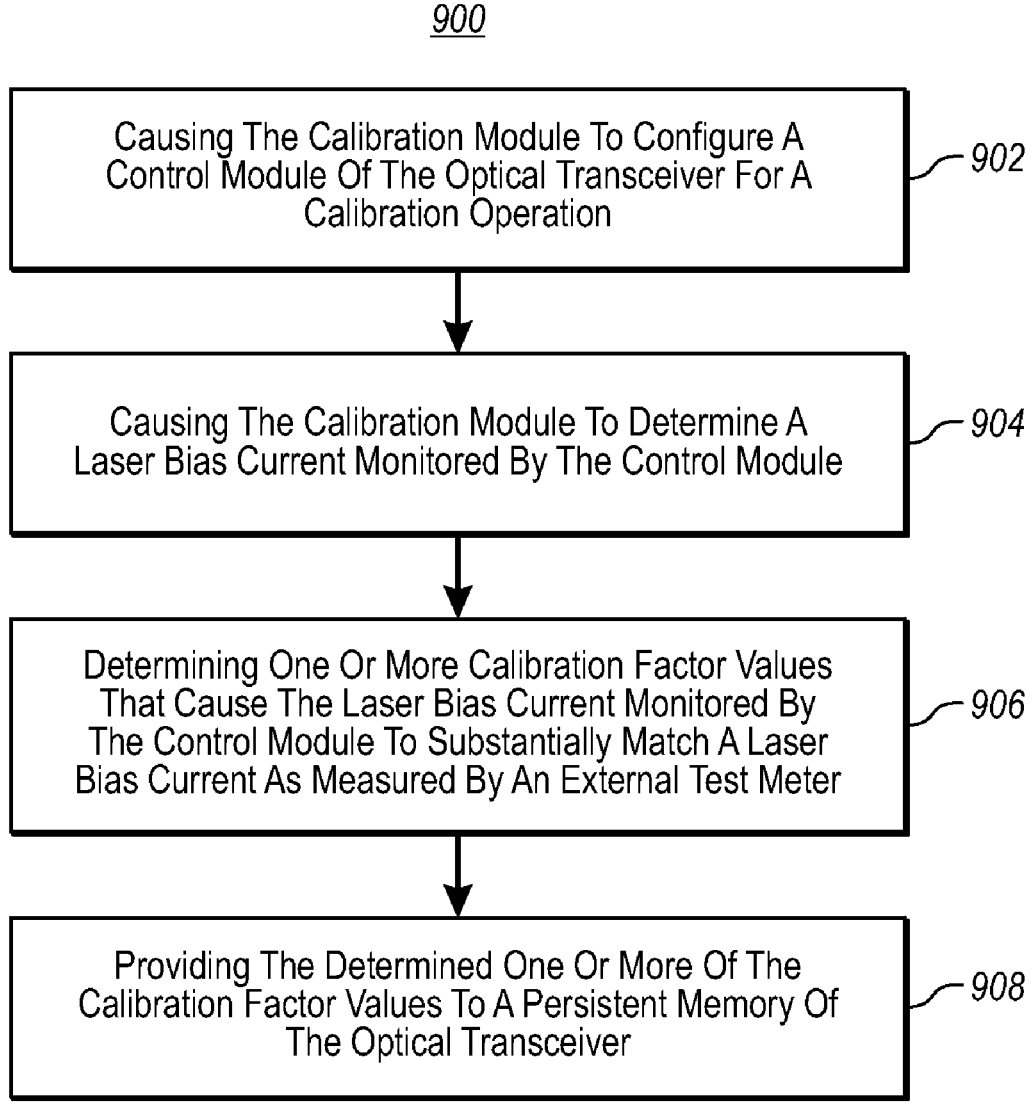
FIG. 9 illustrates a method for a calibration module to calibrate laser bias current in an optical transceiver.

Turning now to FIG. 9, a method 900 for a calibration module to calibrate laser bias current in an optical transceiver is illustrated. The method 900 will be described in relation to the optical transceiver and test environment previously described. Of course, one of skill in the art will appreciate that method 900 may be performed in numerous other environments as circumstances warrant.

The method 900 includes, at 902, causing the calibration module to configure a control module of the optical transceiver for a calibration operation. For example, user input 305 may be received by test module 340. This first user input causes test module 340 to configure control module 105 to operate in a specific way. The GUI 335 may be utilized to receive the first user input.

The method 900 also includes, at 904, causing the calibration module to determine a laser bias current monitored by the control module. For instance, measure module 360 may receive input 306 from transceiver 100. As previously described, input 306 includes the laser bias current of PA/LD 102 as monitored by control module 105 via sensor 211. This measured bias current value may then be determined by measure module 360 and displayed using GUI 335.

The method 900 further includes, at 906, determining one or more calibration factor values that cause the laser bias current monitored by the control module to substantially match a laser bias current as measured by an external test meter. For example, a second set of user input 305 is received by optimization module 370 through the use of GUI 335. This input causes optimization module 370 to determine the one or more calibration factor information 375 that will in turn cause the laser bias current as measured by control module 105 to adjust up or down until the laser bias current as measured by control module 105 is substantially the same as the actual laser bias current measured by test meter 310. It will be appreciated that method step or act 906 may be repeated numerous times until the laser bias current as measured by control module 105 is substantially the same as the actual laser bias current measured by test meter 310. In other words, it may require several iterations of receiving input at optimization module 370 to determine the calibration factor information that causes the laser bias current monitored by the control module to substantially match a laser bias current as measured by an external test meter.

The method 900 additionally includes, at 908, providing the determined one or more calibration factor values to persistent memory of the optical transceiver. For instance, the one or more calibration factor information 375 that cause the laser bias current as measured by control module 105 to be substantially the same as the actual laser bias current measured by test meter 310 may be stored in persistent memory 106. Accordingly, when the optical transceiver is operated at a later date, the stored calibration factor information 375 will help control module 105 account for any errors inherently caused by the sensors 211 as previously described.

Figure 10:
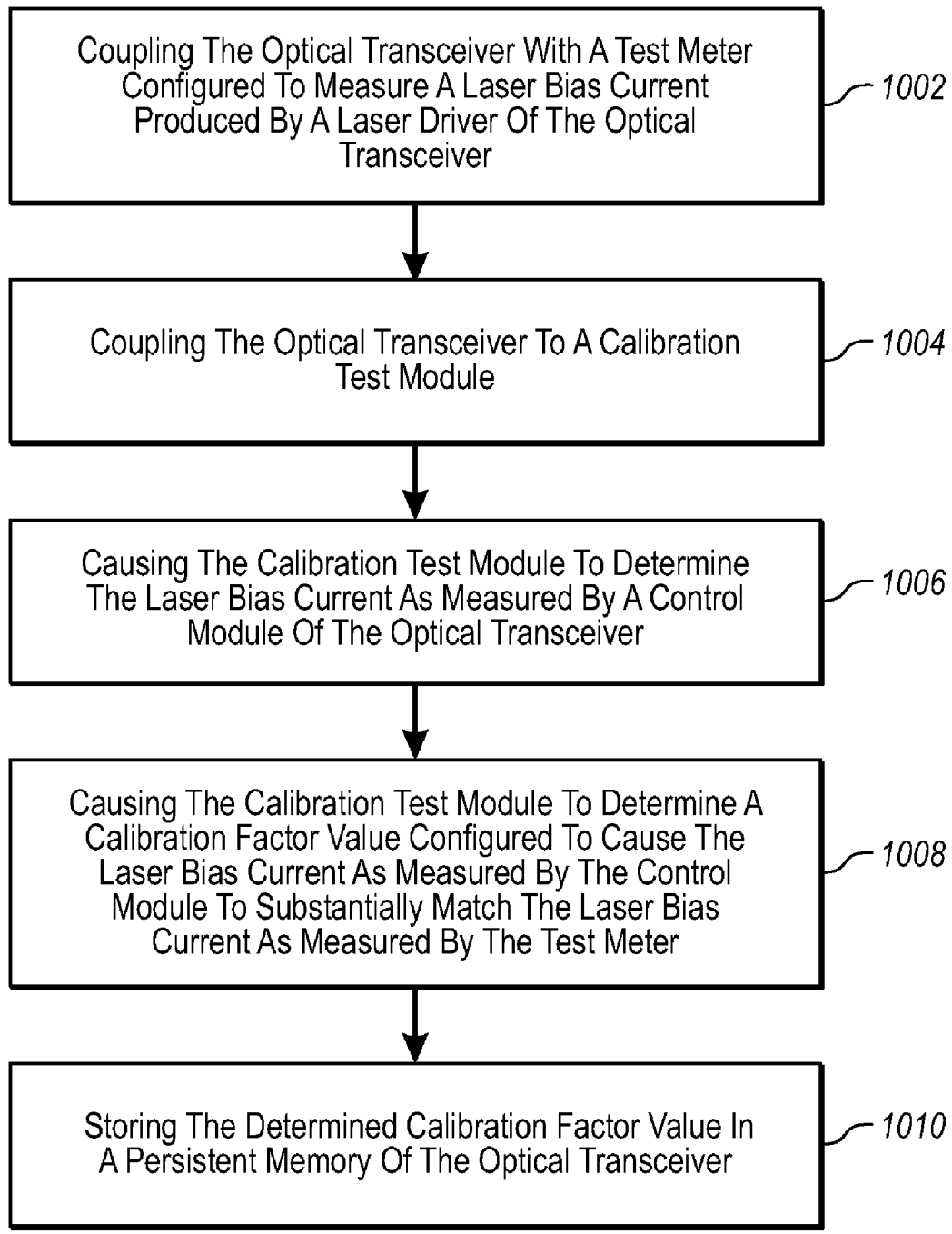
FIG. 10 illustrates a method for calibrating laser bias current in an optical transceiver.

Turning now to FIG. 10, a method 1000 for calibrating laser bias current in an optical transceiver is illustrated. The method 1000 will be described in relation to the optical transceiver and test environment previously described. Of course, one of skill in the art will appreciate that method 1000 may be performed in numerous other environments as circumstances warrant.

The method 1000 includes, at 1002, coupling the optical transceiver to a test meter configured to measure a laser bias current produced by a laser driver of the optical transceiver. For example, optical transceiver 100 may be coupled to test meter 310. In some embodiments, the optical transceiver may also be coupled to the test board 320 as previously described.

The method 1000 also includes, at 1004, coupling the optical transceiver to a calibration test module. For instance, optical transceiver 100 may be coupled to calibration test module 300.

The method 1000 further includes, at 1006, causing the calibration test module to determine the laser bias current as measured by a control module of the optical transceiver and, at 1008, causing the calibration test module to determine a calibration factor value configured to cause the laser bias as measured by the control module to substantially match the laser bias current as measured by the test meter. For example, calibration test module 300 may determine the laser bias current as measured by control module 105 and then may determine the calibration factor information 375 that that then causes the laser bias current as measured by control module 105 to be substantially the same as the actual laser bias current measured by test meter 310 as described above.

The method 1000 further includes, at 1010, storing the determined calibration factor value in a persistent memory of the optical transceiver. For instance, the one or more calibration factor information 375 that cause the laser bias current as measured by control module 105 to be substantially the same as the actual laser bias current measured by test meter 310 may be stored in persistent memory 106. Accordingly, when the optical transceiver is operated at a later date, the stored calibration factor information 375 will help control module 105 account for any errors inherently caused by the sensors 211 as previously described.

Embodiments include general-purpose and/or special-purpose devices or systems that include both hardware and/or software components. Embodiments may also include physical computer-readable media and/or intangible computer-readable media for carrying or having computer-executable instructions, data structures, and/or data signals stored thereon. Such physical computer-readable media and/or intangible computer-readable media can be any available media that can be accessed by a general purpose or special purpose computer. By way of example, and not limitation, such physical computer-readable media can include RAM, ROM, EEPROM, CD-ROM or other optical disk storage, magnetic disk storage or other magnetic storage devices, other semiconductor storage media, or any other physical medium which can be used to store desired data in the form of computer-executable instructions, data structures and/or data signals, and which can be accessed by a general purpose or special purpose computer. Within a general purpose or special purpose computer, intangible computer-readable media can include electromagnetic means for conveying a data signal from one part of the computer to another, such as through circuitry residing in the computer.

When information is transferred or provided over a network or another communications connection (either hardwired, wireless, or a combination of hardwired or wireless) to a computer, hardwired devices for sending and receiving computer-executable instructions, data structures, and/or data signals (e.g., wires, cables, optical fibers, electronic circuitry, chemical, and the like) should properly be viewed as physical computer-readable mediums while wireless carriers or wireless mediums for sending and/or receiving computer-executable instructions, data structures, and/or data signals (e.g., radio communications, satellite communications, infrared communications, and the like) should properly be viewed as intangible computer-readable mediums. Combinations of the above should also be included within the scope of computer-readable media.

Computer-executable instructions include, for example, instructions, data, and/or data signals which cause a general purpose computer, special purpose computer, or special purpose processing device to perform a certain function or group of functions. Although not required, aspects of the invention have been described herein in the general context of computer-executable instructions, such as program modules, being executed by computers, in network environments and/or non-network environments. Generally, program modules include routines, programs, objects, components, and content structures that perform particular tasks or implement particular abstract content types. Computer-executable instructions, associated content structures, and program modules represent examples of program code for executing aspects of the methods disclosed herein.

Embodiments may also include computer program products for use in the systems of the present invention, the computer program product having a physical computer-readable medium having computer readable program code stored thereon, the computer readable program code comprising computer executable instructions that, when executed by a processor, cause the system to perform the methods of the present invention.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A method for a calibration module to calibrate laser bias current in an optical transceiver comprising: causing the calibration module to configure a control module of the optical transceiver for a calibration operation; causing the calibration module to determine a laser bias current monitored by the control module; and determining one or more calibration factor values that cause the laser bias current monitored by the control module to substantially match a laser bias current as measured by an external test meter; wherein determining one or more calibration factor values that cause the laser bias current monitored by the control module to substantially match a laser bias current as measured by an external test meter comprises: receiving input that causes an optimization module of the calibration module to determine the one or more calibration factor values so as to cause the control module to adjust the laser bias current level such that the laser bias current monitored by the control module substantially matches the laser bias current as measured by the external test meter.

2. The method as recited in claim 1, further comprising:
    providing the determined one or more of the calibration factor values to a persistent memory of the optical transceiver.

3. The method in accordance with claim 1, wherein causing the calibration module to configure a control module of the optical transceiver for a calibration operation comprises:

receiving input that causes a test module of the calibration module to configure the control module for the calibration operation.

4. The method in accordance with claim 1, wherein causing the calibration module to determine a laser bias current monitored by the control module comprises:
receiving input that causes a measurement module of the calibration module to determine and display the laser bias current monitored by the control module.

5. The method in accordance with claim 1, wherein the calibration module includes a graphical user interface configured to receive input that causes the calibration module to perform the method.

6. The method in accordance with claim 1, further comprising:
comparing the laser bias current as measured by the control module with the laser bias current as measure by the external test meter to determine if the one or more calibration factor values should be changed to make the laser bias current monitored by the control module substantially match the laser bias current as measured by the external test meter.

7. The method in accordance with claim 1, further comprising:
causing a safety mode of the optical transceiver to become disabled.

8. A method for calibrating laser bias current in an optical transceiver comprising: coupling the optical transceiver with a test meter configured to measure a laser bias current produced by a laser driver of the optical transceiver; coupling the optical transceiver to a calibration test module; causing the calibration test module to determine the laser bias current as measured by a control module of the optical transceiver; and causing the calibration test module to determine a calibration factor value configured to cause the laser bias current as measured by the control module to substantially match the laser bias current as measured by the test meter; wherein causing the calibration test module to determine an optimization factor value configured to cause the laser bias current as measured by the control module to substantially match the laser bias current as measured by the test meter comprises: comparing the laser bias current as measured by the control module with the laser bias current as measured by the external test meter to determine if the calibration factor value should be changed; and if the calibration factor should be changed, receiving input that causes an optimization module of the calibration module to determine the calibration factor value that will cause the control module to adjust the laser bias current level such that the laser bias current monitored by the control module substantially matches the laser bias current as measured by the external test meter.

9. The method as recited in claim 8 further comprising:
storing the determined calibration factor value in a persistent memory of the optical transceiver.

10. The method as recited in claim 8 further comprising:
inserting the optical transceiver into a test board prior to coupling the optical transceiver with calibration test module.

11. The method as recited in claim 8, wherein the calibration test module includes a graphical user interface configured to receive input that causes the calibration test module to determine the laser bias current as measured by a control module and determine the optimization factor value.

12. The method as recited in claim 8, wherein causing the calibration test module to determine the laser bias current as measured by a control module of the optical transceiver comprises:
receiving input that causes a measurement module of the calibration module to determine and display the laser bias current monitored by the control module.

13. The method as recited in claim 8, wherein the calibration test module includes a safety override module configured to cause a safety mode of the optical transceiver to become disabled.

14. A computer program product comprising one or more physical computer-readable media having thereon computer-executable instructions that are structured such that, when executed by one or more processors of a computing system including a calibration module configured to calibrate laser bias current in an optical transceiver, the computing system is caused to perform a method for calibrating laser bias current in an optical transceiver, the method comprising: causing the calibration module to configure a control module of the optical transceiver for a calibration operation; causing the calibration module to determine a laser bias current monitored by the control module; and determining one or more calibration factor values that cause the laser bias current monitored by the control module to substantially match a laser bias current as measured by an external test meter; wherein the physical computer-readable media has thereon computer-executable instructions that, when executed by the one or more processors, further cause the computing system to perform the following: comparing the laser bias current as measured by the control module with the laser bias current as measure by the external test meter to determine if the one or more calibration factor values should be changed to make the laser bias current monitored by the control module substantially match the laser bias current as measured by the external test meter.

15. The computer program product as recited in claim 14, wherein the physical computer-readable media has thereon computer-executable instructions that, when executed by the one or more processors, further cause the computing system to perform the following:
providing the determined one or more of the calibration factor values to a persistent memory of the optical transceiver.

16. The computer program product as recited in claim 14, wherein the calibration module includes a graphical user interface configured to receive input that causes the calibration module to perform the method.

17. The computer program product as recited in claim 14, wherein the physical computer-readable media includes one of RAM, ROM, EEPROM, CD-ROM, other optical disk storage, magnetic disk storage or other magnetic storage devices.

* * * * *